(12) United States Patent
Gosho et al.

(10) Patent No.: US 11,901,197 B2
(45) Date of Patent: Feb. 13, 2024

(54) SUBSTRATE PROCESSING APPARATUS AND SUBSTRATE PROCESSING METHOD

(71) Applicant: Tokyo Electron Limited, Tokyo (JP)

(72) Inventors: Masataka Gosho, Kumamoto (JP); Reijiro Yamanaka, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/689,199

(22) Filed: Mar. 8, 2022

(65) Prior Publication Data

US 2022/0301895 A1  Sep. 22, 2022

(30) Foreign Application Priority Data

Mar. 16, 2021  (JP) ................. 2021-042031
Dec. 2, 2021  (JP) ................. 2021-196119

(51) Int. Cl.
*H01L 21/67* (2006.01)
*H01L 21/02* (2006.01)

(52) U.S. Cl.
CPC .. *H01L 21/67034* (2013.01); *H01L 21/02101* (2013.01)

(58) Field of Classification Search
CPC ........ H01L 21/02101; H01L 21/00–86; G01N 21/5907; G01N 9/002; G01N 9/36; G01N 2291/02818; G01N 9/00
See application file for complete search history.

(56) References Cited

U.S. PATENT DOCUMENTS

2008/0156093 A1* 7/2008 Permuy ............... G01N 11/16
73/32 A

FOREIGN PATENT DOCUMENTS

| KR | 20120041014 A | * | 4/2012 |
| KR | 20180039458 A | * | 4/2018 |
| WO | 2018173861 A1 | | 9/2018 |

OTHER PUBLICATIONS

Bela Liptak, Process Measurement & Analysis vol. I, Instrument Engineers' Handbook (CRC Press 2003). Retrieved from https://app.knovel.com/hotlink/pdf/id:kt00CATQ21/instrument-engineers/radiation-detectors (Year: 2003).*

* cited by examiner

*Primary Examiner* — Mikhail Kornakov
*Assistant Examiner* — Richard Z. Zhang
(74) *Attorney, Agent, or Firm* — Nath, Goldberg & Meyer; Jerald L. Meyer; Tanya E. Harkins

(57) ABSTRACT

A substrate processing apparatus includes: a processing container to which a supercritical fluid is supplied, the processing container being configured to dry a substrate by replacing a drying liquid collected on the substrate with the supercritical fluid; a discharge line configured to discharge a mixed fluid containing the supercritical fluid and the drying liquid from an interior of the processing container; and a density detector configured to detect a density of the mixed fluid flowing through the discharge line.

9 Claims, 7 Drawing Sheets

SUBSTRATE PROCESSING APPARATUS AND SUBSTRATE PROCESSING METHOD

CROSS-REFERENCE TO RELATED APPLICATIONS

This application is based upon and claims the benefit of priority from Japanese Patent Application Nos. 2021-042031 and 2021-196119, filed on Mar. 16, 2021 and Dec. 2, 2021, respectively, the entire contents of which are incorporated herein by reference.

TECHNICAL FIELD

The present disclosure relates to a substrate processing apparatus and a substrate processing method.

BACKGROUND

The substrate processing apparatus disclosed in Patent Document 1 includes a drying part, a discharge line, an acquisition part, and a detection part. The drying part dries a substrate by bringing the substrate, the surface of which is wet with liquid, into contact with a supercritical fluid and replacing the liquid with the supercritical fluid. The discharge line is provided in the drying part to discharge the fluid from the drying part. The acquisition part is provided in the discharge line to acquire optical information about the fluid discharged from the drying part. The detection part detects the presence or absence of liquid inside the drying part based on the optical information acquired by the acquisition part.

PRIOR ART DOCUMENT

Patent Document

Patent Document 1: International Publication No. WO 2018/173861

SUMMARY

According to one embodiment of the present disclosure, there is provided a substrate processing apparatus includes: a processing container to which a supercritical fluid is supplied, the processing container being configured to dry a substrate by replacing a drying liquid collected on the substrate with the supercritical fluid; a discharge line configured to discharge a mixed fluid containing the supercritical fluid and the drying liquid from an interior of the processing container; and a density detector configured to detect a density of the mixed fluid flowing through the discharge line.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
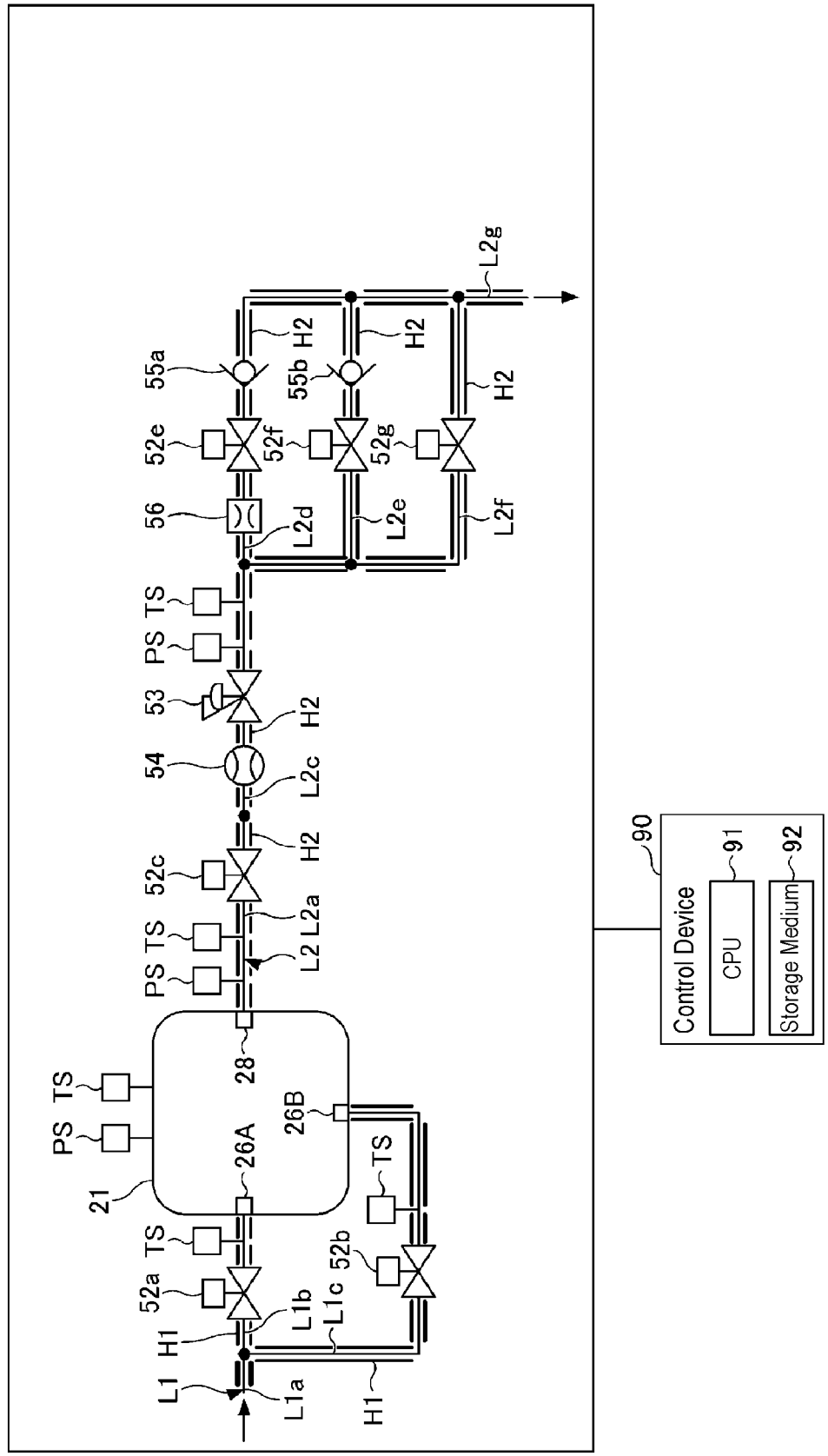
FIG. 1 is a view illustrating a substrate processing apparatus according to an embodiment.

Hereinafter, embodiments of the present disclosure will be described with reference to the drawings. In each drawing, the same or corresponding components may be denoted by the same reference numerals, and a description thereof may be omitted. Herein, the term "upstream" means upstream direction of the flow of a supercritical fluid, and the term "downstream" means downstream direction of the flow of a supercritical fluid. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a substrate processing apparatus 1 of the present embodiment will be described with reference to FIGS. 1 and 2. The substrate processing apparatus 1 dries a substrate W by replacing a drying liquid collected on the substrate W with a supercritical fluid. The supercritical fluid is a fluid that is placed under a temperature higher than a critical temperature and a pressure higher than a critical pressure, and is a fluid in the state in which a liquid and a gas are not distinguishable from each other. By replacing the drying liquid with the supercritical fluid, it is possible to suppress the appearance of a liquid-gas interface in a concave-convex pattern of the substrate W. As a result, it is possible to suppress the generation of surface tension, and thus it is possible to suppress the collapse of the concave-convex pattern. The drying liquid is, for example, an organic solvent such as isopropyl alcohol (IPA), and the supercritical fluid is, for example, $CO_2$.

Figure 2:
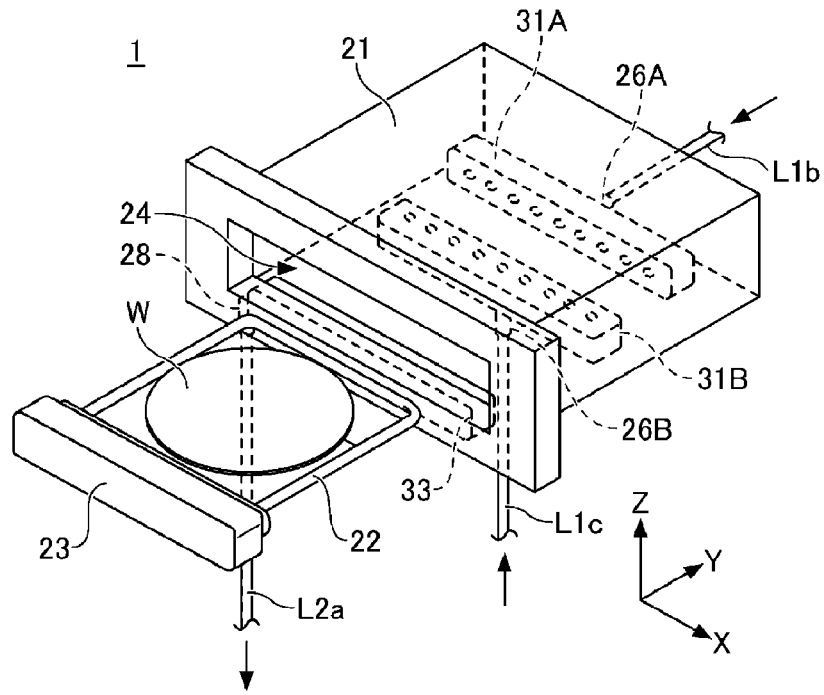
FIG. 2 is a perspective view illustrating a processing container of FIG. 1.

As illustrated in FIG. 2, the substrate processing apparatus 1 includes a processing container 21, a holder 22, and a lid 23. The processing container 21 accommodates therein the substrate W on which a drying liquid is collected. The processing container 21 is provided with an opening 24 through which the substrate W is transferred. The holder 22 holds the substrate W horizontally with a liquid film of the drying liquid orientated upward inside the processing container 21. The lid 23 closes the opening 24 of the processing container 21. Since the lid 23 and the holder 22 are connected to each other, the holder 22 moves together with the lid 23.

The processing container 21 defines a space therein. Supply ports 26A and 26B and a discharge port 28 are provided in the wall of the processing container 21. The supply ports 26A and 26B are connected to a supply line L1 illustrated in FIG. 1. The supply line L1 supplies the supercritical fluid to the processing container 21. The discharge port 28 is connected to a discharge line L2 illustrated in FIG. 1.

The supply port 26A is connected to a side surface of the processing container 21 on the side opposite to the opening 24. The supply port 26B is connected to a bottom surface of the processing container 21. The discharge port 28 is connected to a lower side of the opening 24. Although two supply ports 26A and 26B and one discharge port 28 are illustrated in FIGS. 1 and 2, the number of supply ports 26A and 26B and the number of discharge ports 28, and positions thereof are not particularly limited.

Inside the processing container 21, supply headers 31A and 31B and a discharge header 33 are provided. Each of the supply headers 31A and 31B and the discharge header 33 includes a large number of openings formed therein.

The supply header 31A is connected to the supply port 26A and provided inside the processing container 21 to be adjacent to the side surface opposite to the opening 24. The large number of openings formed in the supply header 31A face the opening 24.

The supply header 31B is connected to the supply port 26B and provided in the center of the bottom surface inside the processing container 21. The large number of openings formed in the supply header 31B face upward.

The discharge header 33 is connected to the discharge port 28, and provided inside the processing container 21 to be adjacent to the side surface of the processing container 21 on the side of the opening 24 and below the opening 24. In addition, the large number of openings formed in the discharge header 33 face the supply header 31A.

The supply headers 31A and 31B supply the supercritical fluid to the interior of the processing container 21. In addition, the discharge header 33 discharges the fluid inside the processing container 21 to the outside. The fluid discharged to the outside by the discharge header 33 includes the supercritical fluid, and further includes vapors of the drying liquid dissolved in the supercritical fluid.

As illustrated in FIG. 1, the substrate processing apparatus 1 includes the supply line L1. The supply line L1 connects a fluid source and the processing container 21. The supercritical fluid is supplied to the supply line L1 from the fluid source. The supply line L1 is provided with a heater HE The heater H1 maintains the supercritical fluid supplied to the processing container 21 at the critical temperature or higher. The heater H1 is provided, for example, over the entire supply line L1.

The supply line L1 includes a common line L1a, a distribution line L1b, and a boost line L1c. An upstream end of the common line L1a is connected to the fluid source, and a downstream end of the common line L1a is connected to the distribution line L1b and the boost line L1c. The distribution line L1b is connected to the supply port 26A, and the boost line L1c is connected to the supply port 26B.

The distribution line L1b is provided with an opening/closing valve 52a and a temperature sensor TS. The opening/closing valve 52a opens/closes a fluid flow path. When the opening/closing valve 52a opens the fluid flow path, the supercritical fluid is supplied into the processing container 21 via the supply port 26A and the supply header 31A (see FIG. 2). Meanwhile, when the opening/closing valve 52a closes the fluid flow path, the supply of the supercritical fluid into the processing container 21 is stopped.

Similarly, the boost line L1c is provided with an opening/closing valve 52b and a temperature sensor TS. The opening/closing valve 52b opens/closes the fluid flow path. When the opening/closing valve 52b opens the fluid flow path, the supercritical fluid is supplied into the processing container 21 via the supply port 26B and the supply header 31B (see FIG. 2). Meanwhile, when the opening/closing valve 52b closes the fluid flow path, the supply of the supercritical fluid into the processing container 21 is stopped.

Although the distribution line L1b and the boost line L1c are separately provided in the present embodiment, they may be integrated with each other.

The substrate processing apparatus 1 includes the discharge line L2. The discharge line L2 discharges the fluid inside the processing container 21. The discharge line L2A is provided with a heater H2. The heater H2 suppresses a change in temperature of the fluid flowing through the discharge line L2 to suppress the liquefaction of the fluid. The heater H2 is provided, for example, over the entire discharge line L2.

The discharge line L2 includes, for example, an opening/closing line L2a, a first common line L2c, a first intermediate line L2d, a second intermediate line L2e, a third intermediate line L2f, and a second common line L2g.

The opening/closing line L2a extends from the discharge port 28 of the processing container 21 to the upstream end of the first common line L2c. The opening/closing line L2a is provided with an opening/closing valve 52c, a temperature sensor TS, and a pressure sensor PS. The opening/closing valve 52c opens/closes the fluid flow path. When the opening/closing valve 52c opens the fluid flow path, the fluid inside the processing container 21 is discharged outside the substrate processing apparatus 1 via the discharge header 33 (see FIG. 2) and the discharge port 28. Meanwhile, when the opening/closing valve 52c closes the fluid flow path, the discharge of the fluid from the processing container 21 is stopped.

The first common line L2c is provided with a pressure-reducing valve 53, a flow meter 54, a temperature sensor TS, and a pressure sensor PS. The pressure-reducing valve 53 reduces a pressure of the fluid on the downstream side of the pressure-reducing valve 53 to be lower than a pressure of the fluid on the upstream side of the pressure-reducing valve 53. The pressure on the upstream side of the pressure-reducing valve 53 is, for example, 14 MPa to 18 MPa, and the pressure on the downstream side of the pressure-reducing valve 53 is, for example, 0.1 MPa to 0.5 MPa. The flow meter 54 measures a flow rate of the fluid before the pressure is reduced, but may measure a flow rate of the fluid after the pressure is reduced.

Each of the first intermediate line L2d, the second intermediate line L2e, and the third intermediate line L2f extends from the downstream end of the first common line L2c to the upstream end of the second common line L2g.

The first intermediate line L2d is provided with an opening/closing valve 52e, a check valve 55a, and an orifice 56. The opening/closing valve 52e opens/closes the fluid flow path. When the opening/closing valve 52e opens the fluid flow path, the fluid inside the processing container 21 passes through the opening/closing valve 52e and is discharged outside the substrate processing apparatus 1. Meanwhile, when the opening/closing valve 52e closes the fluid flow path, the discharge of the fluid through the first intermediate line L2d is stopped. The check valve 55a prevents backflow of the fluid.

Similarly, the second intermediate line L2e is provided with an opening/closing valve 52f and a check valve 55b. The opening/closing valve 52f opens/closes the fluid flow path. When the opening/closing valve 52f opens the fluid flow path, the fluid inside the processing container 21 passes through the opening/closing valve 52f and is discharged outside the substrate processing apparatus 1. Meanwhile, when the opening/closing valve 52f closes the fluid flow path, the discharge of the fluid through the second intermediate line L2e is stopped. The check valve 55b prevents backflow of the fluid.

An opening/closing valve 52g is provided in the third intermediate line L2f. The opening/closing valve 52g opens/closes the fluid flow path. When the opening/closing valve 52g opens the fluid flow path, the fluid inside the processing container 21 passes through the opening/closing valve 52g and is discharged outside the substrate processing apparatus 1. Meanwhile, when the opening/closing valve 52g closes the fluid flow path, the discharge of the fluid through the third intermediate line L2f is stopped.

The first intermediate line L2d, the second intermediate line L2e, and the third intermediate line L2f are separately provided in the present embodiment, but may be integrated with each other. However, in the former case, it is possible to finely control the discharge flow rate of the fluid by discharging the fluid through the plurality of opening/closing valves 52e, 52f, and 52g.

The substrate processing apparatus 1 includes a control device 90. The control device 90 is, for example, a computer, and includes a central processing unit (CPU) 91 and a storage medium 92 such as a memory. The storage medium 92 stores a program for controlling various processes to be executed by the substrate processing apparatus 1. The control device 90 controls the operation of the substrate processing apparatus 1 by causing the CPU 91 to execute the program stored in the storage medium 92. The storage medium 92 may be a non-transient computer readable storage device.

Figure 3:
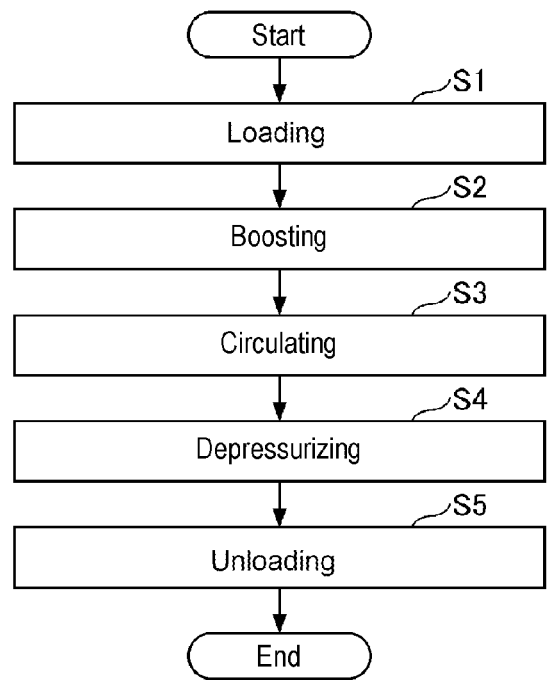
FIG. 3 is a flowchart illustrating a substrate processing method according to an embodiment.

Next, a substrate processing method of the present embodiment will be described with reference to FIG. 3. Steps S1 to S5 illustrated in FIG. 3 are performed under the control of the control device 90.

First, in step S1, a transfer device (not illustrated) loads the substrate W on which the drying liquid is collected into the substrate processing apparatus 1. The holder 22 receives the substrate W from the transfer device and holds the same horizontally with the liquid film of the drying liquid facing upward. The substrate W is accommodated in the processing container 21, and the lid 23 closes the opening 24 of the processing container 21.

Subsequently, in step S2, the supply line L1 supplies the supercritical fluid into the processing container 21 through the supply port 26B and the supply header 31B, thereby increasing an internal pressure of the processing container 21. At that time, the supercritical fluid is supplied from below the substrate W so as to prevent the drying liquid collected on the substrate W from being disturbed. The internal pressure of the processing container 21 is increased to a set pressure equal to or higher than the critical pressure. During this time, the discharge line L2 does not discharge the fluid inside the processing container 21.

Subsequently, in step S3, the supply line L1 supplies the supercritical fluid into the processing container 21 through the supply port 26A and the supply header 31A, and the discharge line L2 discharges the fluid inside the processing container 21. Thus, the supercritical fluid is circulated above the substrate W. The drying liquid dissolved in the supercritical fluid is discharged outside the processing container 21, and the drying liquid collected on the substrate W is replaced with the supercritical fluid, so the substrate W is dried. At that time, the supply flow rate and the discharge flow rate are equal to each other, and the internal pressure of the processing container 21 is maintained at the set pressure.

Subsequently, in step S4, the supply line L1 stops the supply of the supercritical fluid into the processing container 21, and the discharge line L2 discharges the fluid inside the processing container 21, so the interior of the processing container 21 is depressurized. The internal pressure of the processing container 21 is reduced to about atmospheric pressure (0.1 MPa). Thereafter, the lid 23 opens the opening 24 of the processing container 21, and the substrate W is taken out of the processing container 21.

Finally, in step S5, the transfer device (not illustrated) receives the substrate W from the holder 22 and unloads the same to the outside of the substrate processing apparatus 1.

Next, the discharge line L2 according to the present embodiment will be described with reference to FIG. 4. The discharge line L2 discharges a mixed fluid composed of the supercritical fluid and the drying liquid dissolved in the supercritical fluid from the interior of the processing container 21 in the above-described step S3.

As described above, the discharge line L2 includes the opening/closing line L2a and the first common line L2c. The opening/closing line L2a is provided with a pressure sensor PS1, a temperature sensor TS1, and an opening/closing valve 52c in this order from the upstream side to the downstream side. In addition, the first common line L2c is provided with a density detector Ma and a pressure-reducing valve 53 in this order from the upstream side to the downstream side.

The density detector 54a detects a density of the mixed fluid flowing through the discharge line L2 as an index indicating a concentration of the drying liquid in the mixed fluid flowing through the discharge line L2. The higher the concentration of the drying liquid in the mixed fluid, the higher the density of the mixed fluid. Therefore, when the density of the mixed fluid is detected, the concentration of the drying liquid can be known. That is, the index indicating the concentration of the drying liquid can be obtained.

The density detector 54a is provided, for example, on the upstream side of the pressure-reducing valve 53. Almost no pressure loss occurs on the upstream side of the pressure-reducing valve 53. In addition, there is almost no temperature change due to the pressure loss. Therefore, the density of the mixed fluid can be detected at the same temperature and pressure as the internal temperature and pressure of the processing container 21, and thus the concentration of the drying liquid in the interior of the processing container 21 can be detected more accurately.

The density detector 54a may be any density detector as long as it can detect the density of the mixed fluid. As the density detector 54a, a density meter for high temperature and high pressure may be used. For example, a gamma ray density meter or the like that measures density with gamma rays may be used.

Figure 8A:
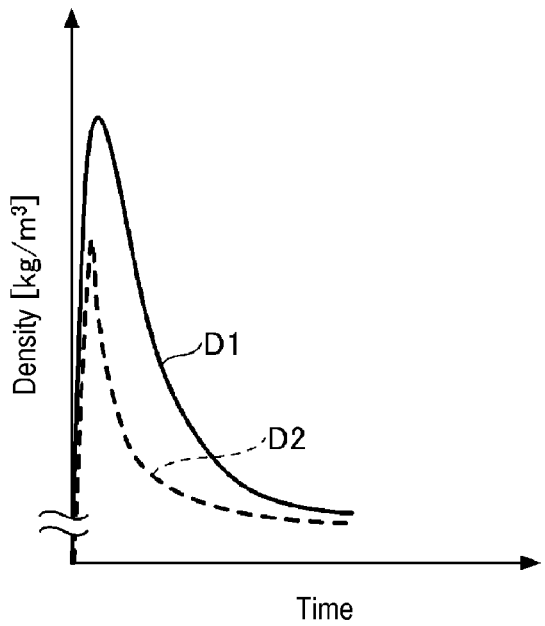
FIG. 8A is a view showing an example of changes in density of a mixed fluid and a reference density.

The density detector 54a detects a density D1 of the mixed fluid flowing through the discharge line L2 every unit time. As a result, time-dependent change data indicated by the solid line in FIG. 8A is obtained. In FIG. 8A, the horizontal axis represents the elapsed time from the initiation of step S3, and the vertical axis represents the density (kg/m³).

Subsequently, time-dependent change data of the density D1 of the mixed fluid indicated by the solid line in FIG. 8A will be described. After the initiation of step S3, the mixed fluid of the supercritical fluid and the drying liquid dissolved in the supercritical fluid is discharged from the processing container 21 to the discharge line L2. The density D1 increases with time and reaches a peak value.

The peak value of the density D1 and the time to reach the peak value depend on an amount of the drying liquid previously collected on the substrate W. The larger the collected amount of the drying liquid, the larger the amount of the drying liquid dissolved in the supercritical fluid, and the larger the peak value of the density D1. In addition, the larger the collected amount of the drying liquid, the longer it takes to dissolve the drying liquid in the supercritical fluid, and the longer it takes for the density D1 to reach the peak value.

After the density D1 reaches the peak value, as the replacement of the drying liquid with the supercritical fluid progresses on the top surface of the substrate W, the concentration of the drying liquid in the mixed fluid discharged from the processing container 21 to the discharge line L2 decreases. As a result, the density D1 decreases. The decrease in the density D1 represents a degree to which the replacement of the drying liquid with the supercritical fluid proceeds, and represents a degree to which the drying of the substrate W proceeds. As the drying of the substrate W proceeds, the amount of the remaining drying liquid becomes smaller, and the rate of decrease in the density D1 becomes slower.

Figure 7:
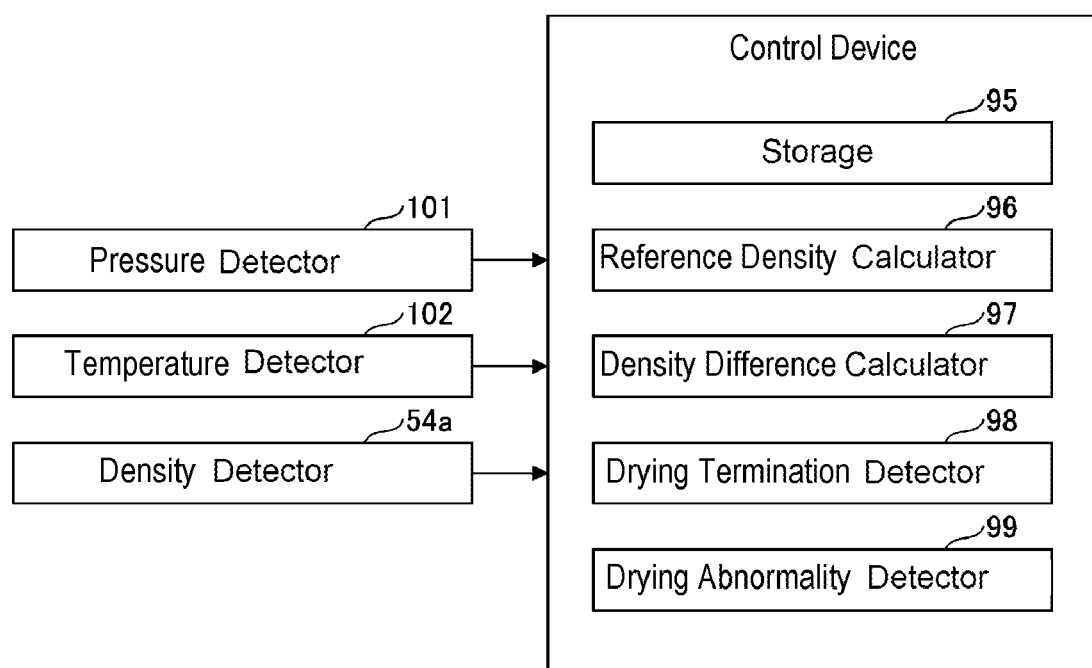
FIG. 7 is a view illustrating an example of components of a controller as a functional block.

Next, the function of the control device 90 will be described with reference to FIG. 7. Each functional block illustrated in FIG. 7 is conceptual and does not necessarily have to be physically configured as illustrated. It is possible to configure all or portion of each functional block to be functionally or physically distributed/integrated in any unit. All or any portion in each processing function performed in each function block may be implemented by a program executed by a CPU, or may be implemented as hardware by wired logic. The control device 90 includes, for example, a storage 95, a reference density calculator 96, a density difference calculator 97, a drying termination detector 98, and a drying abnormality detector 99.

The storage 95 stores time-dependent change data of the density D1 detected by the density detector 54a. In addition, the storage 95 stores time-dependent change data of each of a pressure detected by the pressure detector 101 and a temperature detected by the temperature detector 102. The pressure detector 101 detects the pressure of the mixed fluid flowing through the discharge line L2. The pressure detector 101 includes, for example, the pressure sensor PS1 illustrated in FIG. 4. Meanwhile, the temperature detector 102 detects the temperature of the mixed fluid flowing through the discharge line L2. The temperature detector 102 includes, for example, the temperature sensor TS1 illustrated in FIG. 4. The pressure sensor PS1 and the temperature sensor TS1 are provided, for example, on the downstream side of the processing container 21 and on the upstream side of the opening/closing valve 52c.

The reference density calculator 96 as a first circuitry calculates a reference density D2, which is the density of the supercritical fluid having the same temperature and the same pressure as those of the mixed fluid flowing through the discharge line L2. The reference density D2 is a density of a pure supercritical fluid. Comparing the density D1 and the reference density D2 of the mixed fluid at the same temperature and the same pressure, the reference density D2 is smaller. A density difference ΔD between the density D1 of the mixed fluid and the reference density D2 indicates the concentration of the drying liquid in the mixed fluid. The higher the concentration of the dry liquid, the larger the density difference ΔD. The calculation of the reference density D2 is performed at every unit time, and time-dependent change data of the reference density D2 as shown by the broken line in FIG. 8A is obtained.

Figure 9:
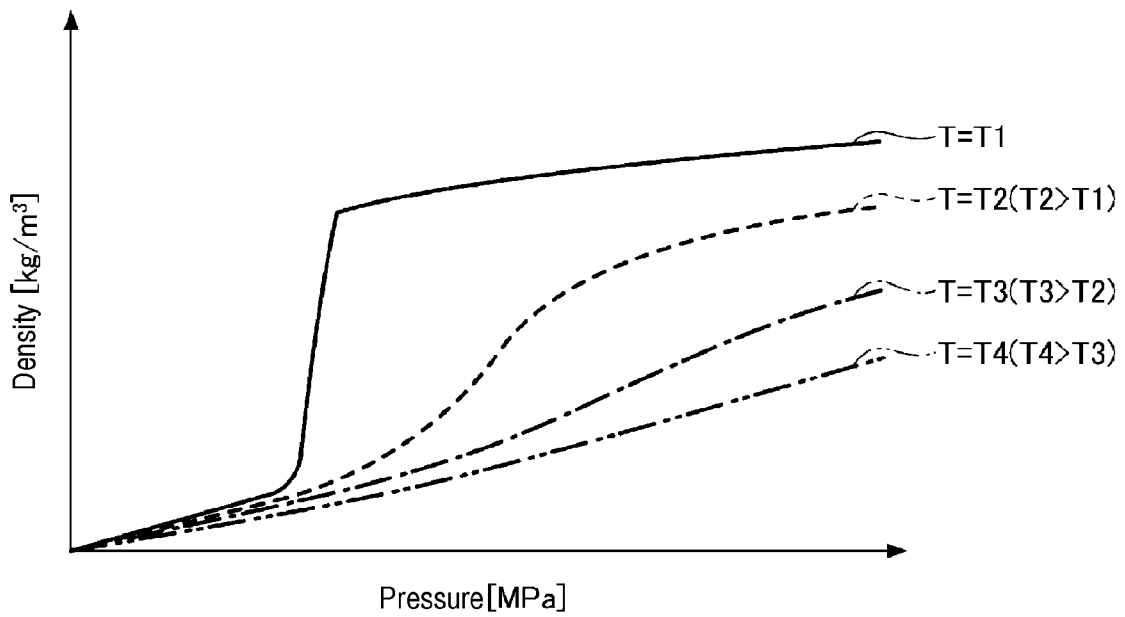
FIG. 9 is a view showing an example of a relationship of density, pressure, and temperature of a pure supercritical fluid.

FIG. 9 shows an example of the relationship of the density, pressure, and temperature of a pure supercritical fluid. As shown in FIG. 9, when the pressure is constant, the higher the temperature, the lower the density. In addition, when the temperature is constant, the higher the pressure, the higher the density. The relationship of the density, the pressure, and the temperature of the supercritical fluid is obtained in advance by experiment or the like and stored in the storage medium 92. This relationship may be stored in the form of an equation. The equation is commonly referred to as a state equation. The reference density calculator 96 calculates the reference density D2 by referring to the equation stored in the storage medium 92 or the like.

The density detector 54a detects the density D1 of the mixed fluid when the mixed fluid passes through the density detector 54a. Therefore, the reference density calculator 96 calculates the reference density D2 to be compared with the density D1 based on the pressure and temperature when the mixed fluid passes through the density detector 54a. For example, the reference density calculator 96 calculates the reference density D2 based on the pressure detected by the pressure detector 101 and the temperature detected by the temperature detector 102.

The reference density calculator 96 may use the pressure itself detected by the pressure sensor PS1 as the pressure when the mixed fluid passes through the density detector 54a. Alternatively, the reference density calculator 96 may obtain the pressure when the mixed fluid passes through the density detector 54a in consideration of a pressure loss generated between the pressure sensor PS1 and the density detector 54a.

Similarly, the reference density calculator 96 may use the temperature itself detected by the temperature sensor TS1 as the temperature when the mixed fluid passes through the density detector 54a. Alternatively, the reference density calculator 96 may obtain the temperature when the mixed fluid passes through the density detector 54a in consideration of a temperature change generated between the temperature sensor TS1 and the density detector 54a.

Almost no pressure loss occurs on the upstream side of the pressure-reducing valve 53. Meanwhile, the flow-out of heat occurs on either the upstream side or the downstream side of the pressure-reducing valve 53. On the upstream side of the pressure-reducing valve 53, the error of the reference density D2 is mainly caused by the temperature change according to a moving distance.

Figure 4:
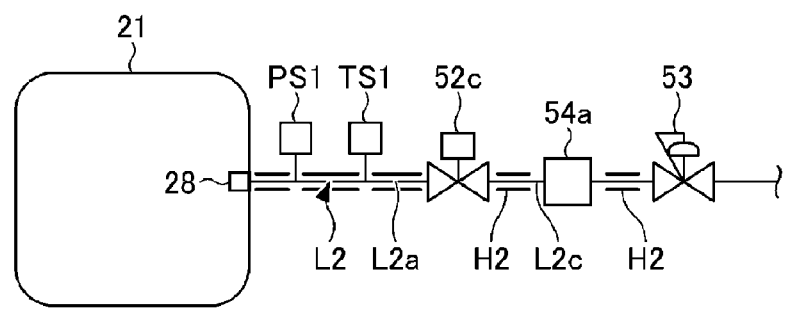
FIG. 4 is a view illustrating a discharge line according to an embodiment.
Figure 5:
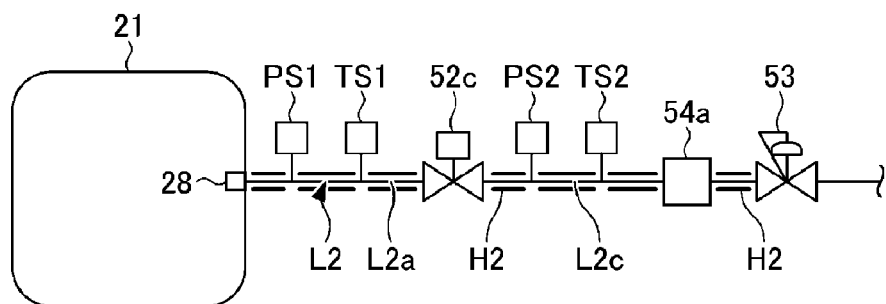
FIG. 5 is a view illustrating a discharge line according to a first modification.

As illustrated in FIG. 4, the pressure sensor PS1 and the temperature sensor TS1 are provided on the downstream side of the processing container 21 and on the upstream side of the opening/closing valve 52c. Meanwhile, as illustrated in FIG. 5, a pressure sensor PS2 and a temperature sensor TS2 may be provided on the downstream side of the opening/closing valve 52c and on the upstream side of the density detector 54a.

When the pressure detector 101 includes the pressure sensor PS2, the pressure detector 101 may detect the pressure of the mixed fluid at a position closer to the density detector 54a compared to the case of including the pressure sensor PS1. Similarly, when the temperature detector 102 includes the temperature sensor TS2, the temperature detector 102 may detect the temperature of the mixed fluid at a position closer to the density detector 54a compared to the case of including the temperature sensor TS1. As a result, the reference density D2 can be obtained with high accuracy.

Figure 6:
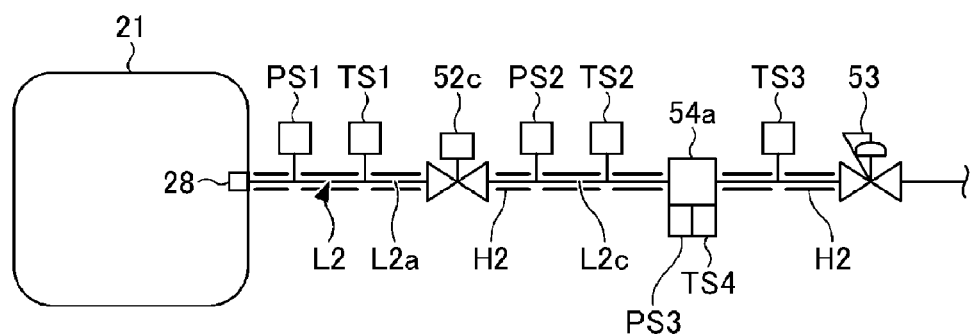
FIG. 6 is a view illustrating a discharge line according to a second modification.

As illustrated in FIG. 6, a temperature sensor TS3 may be provided on the downstream side of the density detector 54a and on the upstream side of the pressure-reducing valve 53. The temperature sensor TS3 is provided in the vicinity of the density detector 54a. In addition, a pressure sensor PS3 and a temperature sensor TS4 may be provided inside the density detector 54a. The temperature sensor TS4 may detect the temperature of the mixed fluid. The temperature sensor TS4 may detect the temperature of the mixed fluid by detecting a temperature of a tube through which the mixed fluid flows.

The temperature detector 102 may include at least one of the three temperature sensors TS2, TS3, and TS4, and may include all the temperature sensors. When all three temperature sensors TS2, TS3, and TS4 are used, the temperature when the mixed fluid passes through the density detector 54a can be calculated more accurately.

Figure 8B:
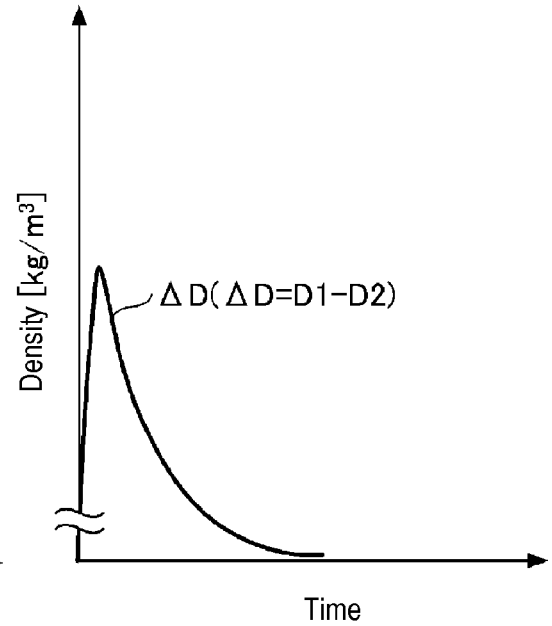
FIG. 8B is a view showing an example of a change in density difference between the density of the mixed fluid and the reference density.

The density difference calculator 97 as a second circuitry calculates the density difference $\Delta D$ between the density D1 of the mixed fluid detected by the density detector 54a and the reference density D2 calculated by the reference density calculator 96. The calculation of the density difference $\Delta D$ is performed every unit time, and time-dependent change data of the density difference $\Delta D$ indicated by the solid line in FIG. 8B is obtained.

Next, the time-dependent change data of the density difference $\Delta D$ indicated by the solid line in FIG. 8B will be described. After the initiation of step S3, the mixed fluid of the supercritical fluid and the drying liquid dissolved in the supercritical fluid is discharged from the processing container 21 to the discharge line L2. The density difference $\Delta D$ increases with time and reaches a peak value.

The peak value of the density difference $\Delta D$ and the time to reach the peak value depend on the collected amount of the drying liquid previously collected on the substrate W. The larger the collected amount of the drying liquid, the larger the amount of the drying liquid dissolved in the supercritical fluid, and the larger the peak value of the density difference $\Delta D$. In addition, the larger the collected amount of the drying liquid, the longer it takes to dissolve the drying liquid in the supercritical fluid, and the longer it takes for the density difference $\Delta D$ to reach the peak value.

After the density difference $\Delta D$ reaches the peak value, as the replacement of the drying liquid with the supercritical fluid proceeds on the top surface of the substrate W, the concentration of the drying liquid in the mixed fluid discharged from the processing container 21 to the discharge line L2 decreases. As a result, the density difference $\Delta D$ decreases. The decrease in the density difference $\Delta D$ represents a degree to which the replacement of the drying liquid with the supercritical fluid proceeds, and represents a degree to which the drying of the substrate W proceeds. As the drying of the substrate W proceeds, the amount of the remaining drying liquid becomes smaller, and the rate of decrease in the density difference $\Delta D$ becomes slower.

The drying termination detector 98 as a third circuitry monitors the density D1 or the density difference $\Delta D$ stored in the storage 95, and detects the termination of drying of the substrate W based on the time-dependent change data. The termination of drying of the substrate W refers to the termination of replacement of the drying liquid with the supercritical fluid on the top surface of the substrate W. When the termination of drying of the substrate W is detected, step S4 is performed.

For example, the drying termination detector 98 detects the termination of drying of the substrate W by detecting that the density D1 is equal to or less than a threshold value. Alternatively, the drying termination detector 98 detects the termination of drying of the substrate W by detecting that the density difference $\Delta D$ is equal to or less than a threshold value. The detection of the termination of drying of the substrate W may be performed after an elapsed time t from the initiation of step S3 reaches a set time t0. The set time t0 is set in advance according to the collected amount of the dry liquid previously collected on the substrate W or the like.

Figure 10:
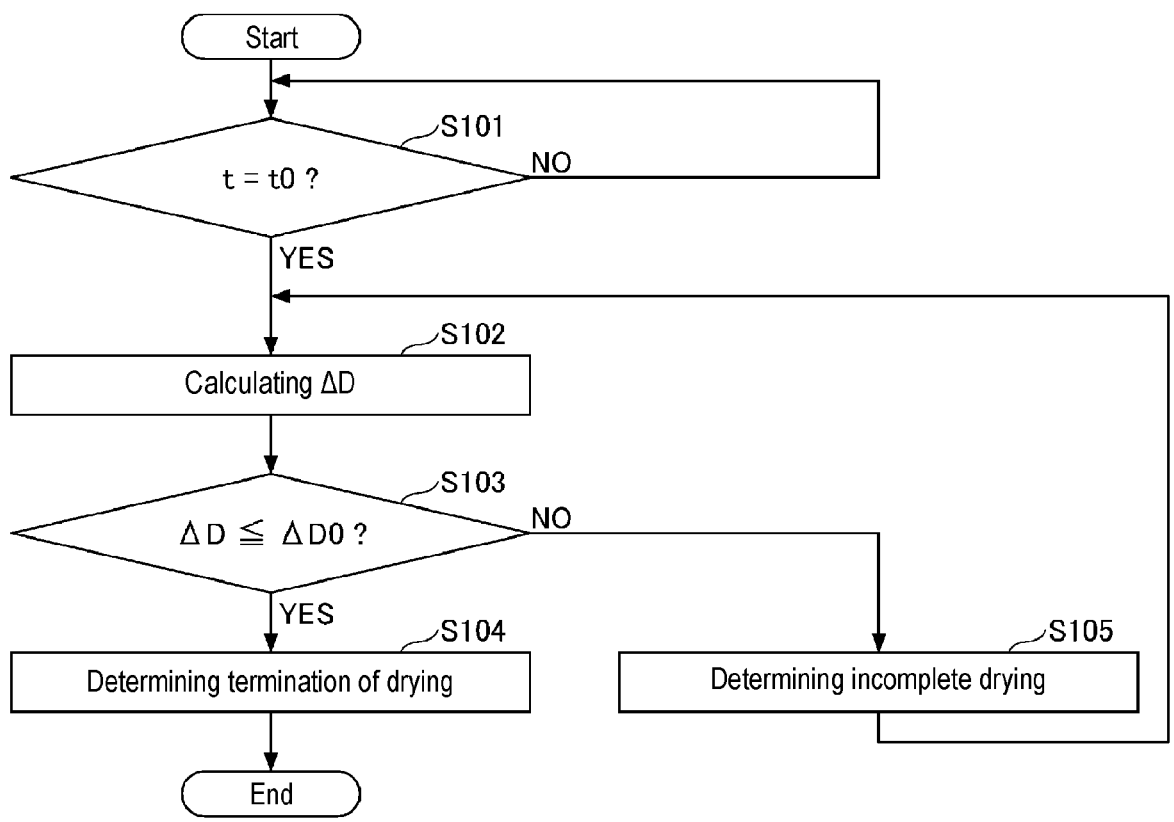
FIG. 10 is a flowchart illustrating an exemplary process performed by a drying termination detector.

Next, an example of a process performed by the drying termination detector 98 will be described with reference to FIG. 10. In FIG. 10, the drying termination detector 98 determines whether or not the drying is terminated based on the density difference $\Delta D$, but may determine whether or not the drying is terminated based on the density D1. In the latter case, in FIG. 10, the density difference $\Delta D$ may be referred to as the density D1.

First, in step S101, the drying termination detector 98 checks whether or not the elapsed time t has reached the set time t0. When the elapsed time t has not reached the set time t0 (step S101, "NO"), the drying termination detector 98 repeats the above-described step S101 after the lapse of a unit time.

Meanwhile, when the elapsed time t has reached the set time t0 (step S101, "YES"), the drying termination detector 98 calculates the density difference $\Delta D$ by the density difference calculator 97 (step S102). Subsequently, the drying termination detector 98 determines whether or not the density difference $\Delta D$ measured in step S102 is equal to or less than a threshold value $\Delta D0$ (step S103).

When the density difference $\Delta D$ exceeds the threshold value $\Delta D0$ (step S103, "NO"), the drying termination detector 98 determines that the drying of the substrate W is not terminated because the concentration of the drying liquid in the mixed fluid is high (step S105). Thereafter, the circulation in step S3 is extended, and the drying termination detector 98 repeats the above-described step S102.

Meanwhile, when the density difference $\Delta D$ is equal to or less than the threshold value $\Delta D0$ (steps S103, "YES"), the drying termination detector 98 determines that the drying of the substrate W is terminated because the concentration of the drying liquid in the mixed fluid is low (step S104). Thereafter, the drying termination detector 98 terminates the current process. Thereafter, the depressurization in step S4 is started.

Since the drying of the substrate W is performed inside the processing container 21, it is not possible to directly observe the drying state of the substrate W. Therefore, conventionally, the circulation time in step S3 was set longer to reliably terminate the drying of the substrate W before the initiation of depressurization in step S4. This causes unnecessary consumption of time.

According to the present embodiment, by detecting the termination of drying of the substrate W using the drying termination detector 98, the initiation timing of depressurization in step S4 can be made earlier than that in the conventional case, and thus the throughput can be improved.

The initiation of depressurization in step S4 may be prohibited until the drying termination detector 98 detects the termination of drying of the substrate W. When the initiation timing of depressurization in step S4 is erroneously set earlier, the initiation timing can be optimized.

The drying abnormality detector 99 as a fourth circuitry monitors the density D1 or the density difference ΔD stored in the storage 95, and detects a drying abnormality of the substrate W based on the time-dependent change data. The drying abnormality of the substrate W includes, for example, an abnormality in the collected amount of the drying liquid previously collected on the substrate W. When the collected amount of the drying liquid is too large, particles may be generated. When the collected amount of the drying liquid is too small, a concave-convex pattern may collapse.

In addition, the drying abnormality detector 99 may detect an abnormality in the length of the drying time of the substrate W as the drying abnormality of the substrate W. The drying time is the elapsed time t until the density D1 or the density difference ΔD reaches the threshold value. When the drying time is too long, it may be considered that the collected amount of the drying liquid previously collected on the substrate W is too large, or a problem has occurred in the substrate processing apparatus 1.

Figure 11:
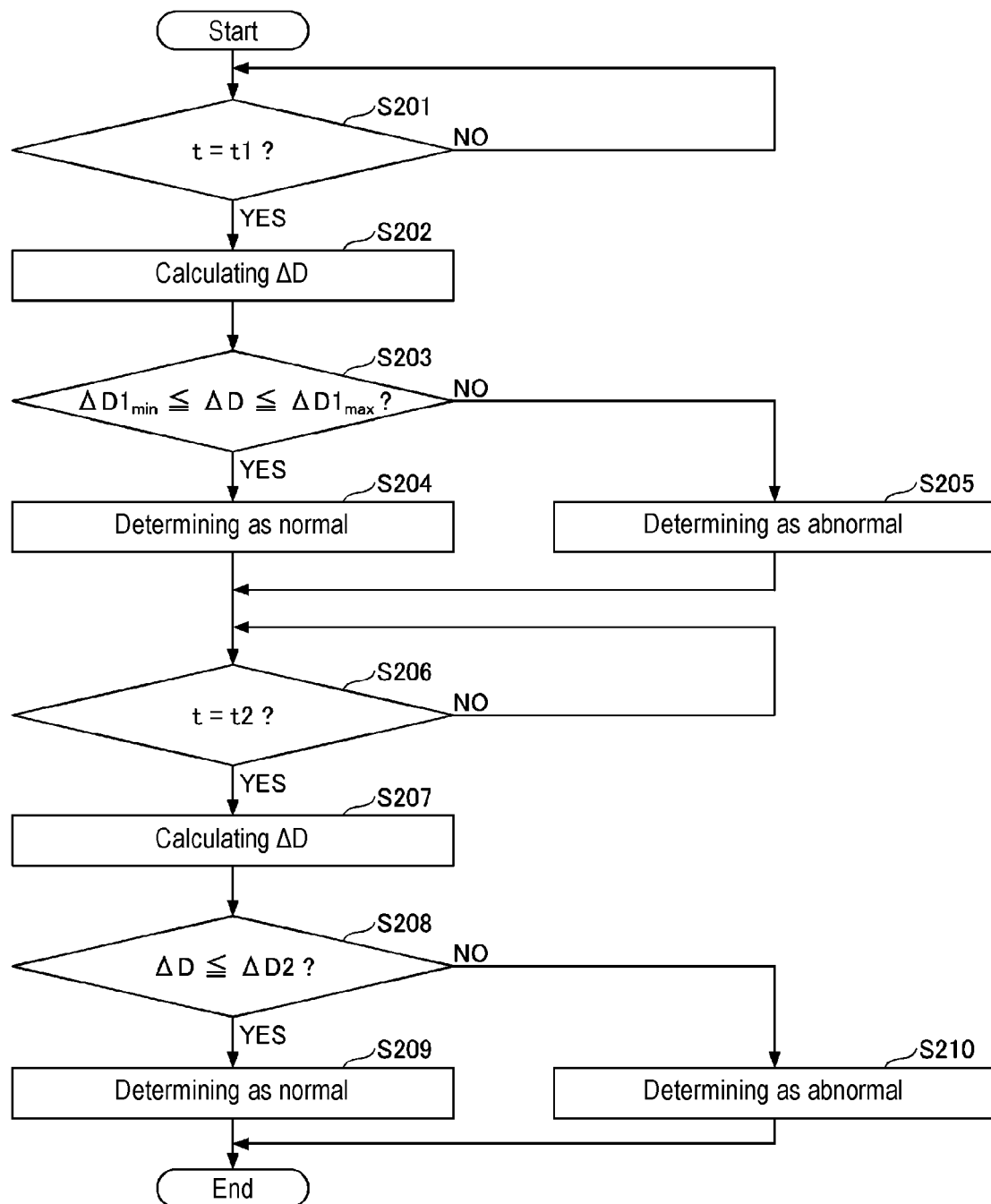
FIG. 11 is a flowchart illustrating an exemplary process performed by a drying abnormality detector.

Next, an example of a process performed by the drying abnormality detector 99 will be described with reference to FIG. 11. In FIG. 11, the drying abnormality detector 99 determines whether it is normal or abnormal based on the density difference ΔD, but may determine whether it is normal or abnormal based on the density D1. In the latter case, in FIG. 11, the density difference ΔD may be referred to as the density D1.

First, in step S201, the drying termination detector 99 checks whether or not the elapsed time t has reached a set time t1. The set time t1 is set such that the density difference ΔD reaches the peak value when there is no drying abnormality. When the elapsed time t has not reached the set time t1 (step S201, "NO"), the drying abnormality detector 99 repeats the above-described step S201 after the lapse of a unit time.

Meanwhile, when the elapsed time t has reached the set time t1 (step S201, "YES"), the drying abnormality detector 99 calculates the density difference ΔD by the density difference calculator 97 (step S202). Subsequently, the drying abnormality detector 99 determines whether or not the density difference ΔD measured at the time of t=t1 is equal to or larger than a lower limit value $ΔD1_{min}$ and equal to or smaller than an upper limit value $ΔD1_{min}$. (step S203).

When the density difference ΔD at the time of t=t1 is equal to or larger than the lower limit value $ΔD1_{min}$ and equal to or smaller than the upper limit value $ΔD1_{min}$. (steps S203, "YES"), the density difference ΔD is within an allowable range. Thus, the drying abnormality detector 99 determines that the collected amount of the dry liquid previously collected on the substrate W is normal (step S204). Thereafter, the drying abnormality detector 99 performs step S206.

When the density difference ΔD at the time of t=t1 is smaller than the lower limit value $ΔD1_{min}$ or exceeds the upper limit value $ΔD1_{min}$. (step S203, "NO"), the density difference ΔD is out of the allowable range. Thus, the drying abnormality detector 99 determines that the collected amount of the dry liquid previously collected on the substrate W is abnormal (step S205). Thereafter, the drying abnormality detector 99 performs step S206.

In step S206, the drying abnormality detector 99 checks whether or not the elapsed time t has reached a set time t2. The set time t2 is set such that the concentration of the drying liquid in the mixed fluid is equal to or lower than a threshold value when there is no drying abnormality. The set time t2 may be the same as the set time t0 shown in FIG. 10. When the elapsed time t has not reached the set time t2 (step S206, "NO"), the drying abnormality detector 99 repeats the above-described step S206 after the lapse of a unit time.

Meanwhile, when the elapsed time t has reached the set time t2 (step S206, "YES"), the drying abnormality detector 99 calculates the density difference ΔD by the density difference calculator 97 (step S207). Subsequently, the drying abnormality detector 99 determines whether or not the density difference ΔD measured at the time of t=t2 is ΔD2 (step S208). The threshold value ΔD2 may be the same as the threshold value ΔD0 illustrated in FIG. 10.

When the density difference ΔD at the time of t=t2 is equal to or smaller than the threshold value ΔD2 (step S208, "YES"), the drying abnormality detector 99 determines that the length of the drying time is normal (step S209). Thereafter, the drying abnormality detector 99 terminates the current process.

When the density difference ΔD at the time of t=t2 exceeds the threshold value ΔD2 (step S208, "NO"), the drying abnormality detector 99 determines that the length of the drying time is abnormal (step S210). Thereafter, the drying abnormality detector 99 terminates the current process.

When the density difference ΔD at the time of t=t2 exceeds the threshold value ΔD2 (step S208, "NO"), the circulation in step S3 may be extended as in FIG. 10.

When the drying time is too long, it may be considered that the collected amount of the drying liquid is too large or a problem has occurred in the substrate processing apparatus 1. It is possible to determine which problem has occurred using the result of check in step S203.

That is, when it is determined that the collected amount of the drying liquid is normal as the result of check in step S203, and it is determined that the length of the drying time is abnormal as the result of check in step S208, it may be considered that a problem has occurred in the substrate processing apparatus 1.

The substrate W for which the drying abnormality has been detected by the drying abnormality detector 99 is treated as a defective product, and the subsequent process is stopped. It is possible to prevent an unnecessary process from being performed on defective products.

According to an aspect of the present disclosure, it is possible to obtain an index indicating a concentration of a drying liquid in a mixed fluid.

Although the embodiments or the like of the substrate processing apparatus and the substrate processing method according to the present disclosure have been described above, the present disclosure is not limited to the above-described embodiments or the like. Various changes, modifications, substitutions, additions, deletions, and combinations can be made within the scope of the claims. Of course, these also fall within the technical scope of the present disclosure.

What is claimed is:

1. A substrate processing apparatus comprising:
a processing container to which a supercritical fluid is supplied, the processing container being configured to dry a substrate by replacing a drying liquid collected on the substrate with the supercritical fluid;
a discharge line configured to discharge a mixed fluid containing the supercritical fluid and the drying liquid from an interior of the processing container;
a density meter installed in the discharge line and configured to detect a density of the mixed fluid flowing through the discharge line;

a first circuitry configured to calculate a reference density which is a density of the supercritical fluid having a temperature and a pressure that are the same as a temperature and a pressure of the mixed fluid flowing through the discharge line; and a second circuitry configured to calculate a density difference between the density of the mixed fluid detected by the density meter and the reference density calculated by the first circuitry.

2. The substrate processing apparatus of claim 1, further comprising:

one or more pressure sensors installed in the discharge line and configured to detect the pressure of the mixed fluid flowing through the discharge line; and one or more temperature sensors installed in the discharge line and configured to detect the temperature of the mixed fluid flowing through the discharge line, wherein the first circuitry calculates the reference density based on the pressure detected by the one or more pressure sensors and the temperature detected by the one or more temperature sensors.

3. The substrate processing apparatus of claim 2, wherein the one or more temperature sensors are further configured to detect the temperature of the mixed fluid inside the density meter.

4. The substrate processing apparatus of claim 3, further comprising:

a third circuitry configured to detect a termination of the drying of the substrate by monitoring the density difference calculated by the second circuitry and detecting that the density difference is equal to or smaller than a threshold value.

5. The substrate processing apparatus of claim 4, further comprising:

a fourth circuitry configured to detect an abnormality in a collected amount of the drying liquid collected on the substrate depending on whether or not the density difference is within an allowable range at a set time elapsed from an initiation of the discharge of the mixed fluid by the discharge line.

6. The substrate processing apparatus of claim 3, further comprising:

a fourth circuitry configured to detect an abnormality in a collected amount of the drying liquid collected on the substrate depending on whether or not the density difference is within an allowable range at a set time elapsed from an initiation of the discharge of the mixed fluid by the discharge line.

7. The substrate processing apparatus of claim 1, further comprising:

a third circuitry configured to detect a termination of the drying of the substrate based on time-dependent change data of the density of the mixed fluid detected by the density meter.

8. The substrate processing apparatus of claim 7, further comprising:

a fourth circuitry configured to detect an abnormality in the drying of the substrate based on the time-dependent change data of the density of the mixed fluid detected by the density meter.

9. The substrate processing apparatus of claim 1, further comprising:

a fourth circuitry configured to detect an abnormality in the drying of the substrate based on time-dependent change data of the density of the mixed fluid detected by the density meter.

* * * * *